(12) United States Patent  
Coolbaugh et al.

(10) Patent No.: US 7,518,215 B2
(45) Date of Patent: Apr. 14, 2009

(54) ONE MASK HYPERABRUPT JUNCTION VARACTOR USING A COMPENSATED CATHODE CONTACT

(75) Inventors: Douglas D. Coolbaugh, Essex Junction, VT (US); Stephen S. Furkay, South Burlington, VT (US); Jeffrey B. Johnson, South Burlington, VT (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 10/905,486

(22) Filed: Jan. 6, 2005

(65) Prior Publication Data

US 2006/0145300 A1 Jul. 6, 2006

(51) Int. Cl.
 *H01L 29/93* (2006.01)
(52) U.S. Cl. .............................. 257/595; 257/E29.344
(58) Field of Classification Search ................ 257/595, 257/312, 480, E29.344, E29.345; 438/379
 See application file for complete search history.

(56) References Cited

U.S. PATENT DOCUMENTS

| 4,226,648 | A | 10/1980 | Goodwin et al. |
| 4,642,580 | A | 2/1987 | Scott |
| 4,827,319 | A | 5/1989 | Pavlidis et al. |
| 5,557,140 | A | 9/1996 | Nguyen et al. |
| 6,521,506 | B1 | 2/2003 | Coolbaugh et al. |
| 6,559,024 | B1 | 5/2003 | Boles et al. |
| 7,183,628 | B2 * | 2/2007 | Coolbaugh et al. .......... 257/595 |
| 2004/0235257 | A1 * | 11/2004 | Johansson et al. ........... 438/379 |

FOREIGN PATENT DOCUMENTS

JP 1019779 A 1/1989

* cited by examiner

*Primary Examiner*—M. Wilczewski
*Assistant Examiner*—Candice Y Chan
(74) *Attorney, Agent, or Firm*—Scully, Scott, Murphy & Presser, P.C.; Riyon Harding

(57) ABSTRACT

A semiconductor structure comprising a hyperabrupt junction varactor with a compensated cathode contact as well as a method of fabricating the same are disclosed. The method includes a single implant mask which is used in forming the subcollector/cathode, collector/well and hyperabrupt junction.

9 Claims, 4 Drawing Sheets

ONE MASK HYPERABRUPT JUNCTION VARACTOR USING A COMPENSATED CATHODE CONTACT

FIELD OF THE INVENTION

The present invention relates to a semiconductor structure that includes a hyperabrupt junction varactor that is tunability and has a high quality factor, Q as well as a process for fabricating such a semiconductor structure. The inventive semiconductor structure, which includes a hyperabrupt junction varactor with a compensated cathode contact, is highly suitable for use in complementary metal oxide semiconductor (CMOS) and/or bipolar technologies. In particular, the inventive structure is highly suitable for use as a component in mobile or cellular phones, personnel digital assistances (PDAs) and other high radio frequency (RF) electronic devices.

BACKGROUND OF THE INVENTION

Varactors form a class of tunable semiconductor capacitors typically derived from pn-junctions, where the pn-junction is operated in a reverse bias state. The varactor's capacitance can be varied by adjusting the reverse bias voltage. Hence, varactors can be characterized by a CV tuning curve. Varactors are especially useful in oscillation circuits, especially voltage-controlled oscillators (VCOs), where the varactor's tunability is used to tune the oscillation frequency of the circuit. Varactors thus find use in cellular or mobile phones, PDAs, televisions, radios, computers, active filters, and wherever a first signal is synchronized to a second signal.

Varactors that include an ion-implanted hyperabrupt junction are known and are referred to in the art as "hyperabrupt junction varactors". See, for example, U.S. Pat. No. 4,226,648 to Goodwin, et al., U.S. Pat. No. 4,827,319 to Pavlidis, et al, U.S. Pat. No. 5,557,140 to Nguyen, et al. and U.S. Pat. No. 6,521,506 to Coolbaugh, et al. The term "hyperabrupt" is used to denote the profile of the pn junction. Hyperabrupt junction varactors have a doping profile that changes in a controlled non-linear way with density of the dopants increasing towards the junction and abruptly dropping to zero at the junction.

Hyperabrupt junction varactors have a higher tuning range than pn-diode varactors, Schottky diode varactors and metal oxide semiconductor (MOS) diode varactors. Moreover, hyperabrupt junction varactors have an almost linear CV characteristic along with a high quality factor Q. These figures of merit, i.e., tunability, high Q, and linear CV, make the hyperabrupt junction varactor the device of choice for designers of VCOs.

In order to implement a hyperabrupt junction varactor, which is independent of critical CMOS and BiCMOS processes, the prior art technique requires that at least two unique critical implant mask levels be implemented. For example, one implant mask level is needed to form the subcollector and/or the n-type implant for the hyperabrupt junction varactor and another implant mask level is needed to implement the p+ implant and/or the hyperabrupt implant to form the anode device.

In order for one to make a one mask level hyperabrupt junction varactor, one would need to depend/implement the p+ implant from a standard pFET source/drain implant or similar p+ implants from the bipolar emitter. Such a process would, however, restrict the modularity of the hyperabrupt varactor process since the n-type implant used to form the hyperabrupt junction would need to be tailored to the specific p+ source/drain or emitter implant technologies. In addition, using the p+ source/drain implant or the emitter implant will cause multiple issues in the future since it is common practice to adjust the p+ implant to tune specific devices, e.g., pFETs, p+ polySi resistors, p+ diffusion resistors and bipolar transistors back to specification. Any minor adjustments to the energy or the dose can cause a large shift in the hyperabrupt junction varactor using it.

FIG. 1 shows a cross sectional view of a typical prior art semiconductor structure 10A that includes a one cathode contact and a hyperabrupt junction varactor. The hyperabrupt junction varactor of the prior art structure was fabricated using at least two critical masking levels. The structure 10A shown in FIG. 1 includes a Si-containing substrate 12 that comprises a buried subcollector/cathode 14, a collector 16, trench isolation regions 18, reach-through implant region 20 and hyperabrupt dopant region 24. The reach-through implant region 20 is in contact with the subcollector/cathode 14 at one point in this prior art structure. The buried subcollector 14, collector 16, and reach-through implant region 20 are comprised of the same conductivity type dopant (p-type or n-type, with n-type being preferred). The dopant concentration within regions 14, 16 and 20, however, is different. For example, the buried subcollector 14 and the reach-through implant 20 are more heavily doped than the collector 16. Atop the substrate 12, there is shown a silicide region 32 which is in contact with the reach-through implant region 20. Dielectric film 30 is also shown atop the substrate 12 and it is located atop the trench isolation regions 18. A base region 25 comprising, for example, doped polySi, is located atop the substrate 12 as well. The base region 25 comprises a monocrystalline portion 26 over the Si-containing substrate 12, and a polycrystalline portion 27 over the trench isolation regions 18 and dielectric film 30. A silicide region 34 is also located atop the base region 25.

In addition to the one cathode contact design described above, it is also possible to form a two-cathode contact structure utilizing prior art methods. The two-cathode contact containing structure 10B is shown in FIG. 2. The reference numerals used in FIG. 2 are the same as those used in FIG. 1 therefore the elements depicted in the two-cathode design shown in FIG. 2 are the same as that described above in regard to FIG. 1. The hyperabrupt junction varactor of the prior art structure shown in FIG. 2 was also made using at least two critical masking levels.

In both prior art structures mentioned above, two critical masking levels are required to form the hyperabrupt dopant region. In the semiconductor industry, there is an ongoing complaint that prior art hyperabrupt junction varactors require the two additional implant mask levels to form the same. Moreover, there is a need to find a solution that would enable the use of a one masking level device, which avoids the problems mentioned above.

SUMMARY OF THE INVENTION

The present invention provides a semiconductor structure including a hyperabrupt junction and a compensated cathode contact. The hyperabrupt junction varactor of the inventive structure including the hyperabrupt junction is highly tunable, has a high Q and a linear CV curve. The cathode contact, which is located in a region of a substrate adjacent the hyperabrupt junction, is compensated. By 'compensated', it is meant that the cathode contact of the present invention has a high enough dopant concentration of one type to effectively counter dope an opposite type dopant.

Specially, and in broad terms, the inventive semiconductor structure comprises:

a hyperabrupt junction located in an anode region of a semiconductor substrate; and at least one compensated cathode contact located adjacent to, yet isolated from, said hyperabrupt junction, said at least one compensated cathode provides a first conductivity type dopant region at a surface of a reach-through dopant region, said reach-through dopant region is in contact with an underlying first dopant region which is a subcollector and/or a cathode.

The inventive semiconductor structure can be used as a substrate in CMOS and/or bipolar technologies in which one or more CMOS and/or bipolar devices are located thereon.

In addition to providing the inventive semiconductor structure described above, the present invention also provides a method of fabricating such a structure in which a single masking level is used to form the hyperabrupt junction, the subcollector/cathode and the collector/well region. Specifically, the present invention provides a method of fabricating a semiconductor structure, particularly a hyperabrupt junction varactor in CMOS or BiCMOS processing, that does not include the use of an epitaxial growth process, which is a common process used in fabricating prior art hyperabrupt junction varactors. More specifically, the present invention provides a method of fabricating a hyperabrupt junction varactor that is vertical using a single implant mask to form the hyperabrupt junction, the subcollector/cathode and the collector/well region.

In broad terms, the method of the present invention used in forming the inventive semiconductor structure comprises the steps of:

providing a semiconductor substrate including a plurality of isolation regions located therein, said plurality of isolation regions defining an anode region and at least one cathode region within said semiconductor substrate;

forming a reach-through dopant region in said at least one cathode region;

forming a subcollector/cathode, a collector/well region and a hyperabrupt junction in said semiconductor substrate using a single implant mask, said hyperabrupt junction is located in both said anode and cathode regions; and selectively implanting into the cathode region so as to convert the hyperabrupt junction located therein into a compensated cathode contact.

In accordance with the present invention, the forming of the inventive hyperabrupt junction includes the implantation of the upper dopant region thereof which is performed at high enough doses to form a diode layer of the varactor, yet low enough to be compensated for in the cathode contact region.

DETAILED DESCRIPTION OF THE INVENTION

Figure 1:
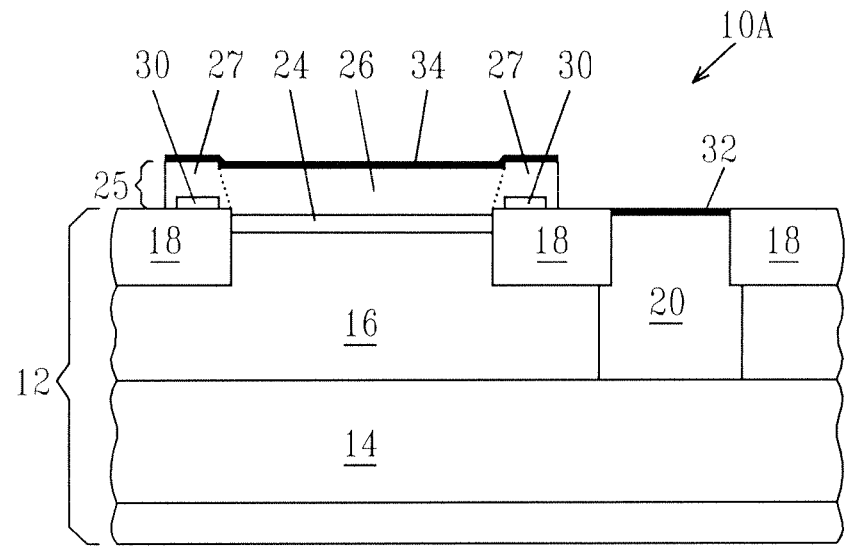
FIG. 1 is a pictorial representation (through a cross sectional view) illustrating a prior art structure including a hyperabrupt junction and a single cathode contact.

The present invention, which provides a semiconductor structure including a hyperabrupt junction varactor with a compensated cathode contact as well as a method of fabricating the same in which a single mask is used to form the subcollector/cathode, collector/well, and hyperabrupt junction, will now be described in greater detail by referring to the drawings that accompany the present application. The drawings of the present application are provided herein for illustrative purposes and they are thus not drawn to scale.

Figure 3A:
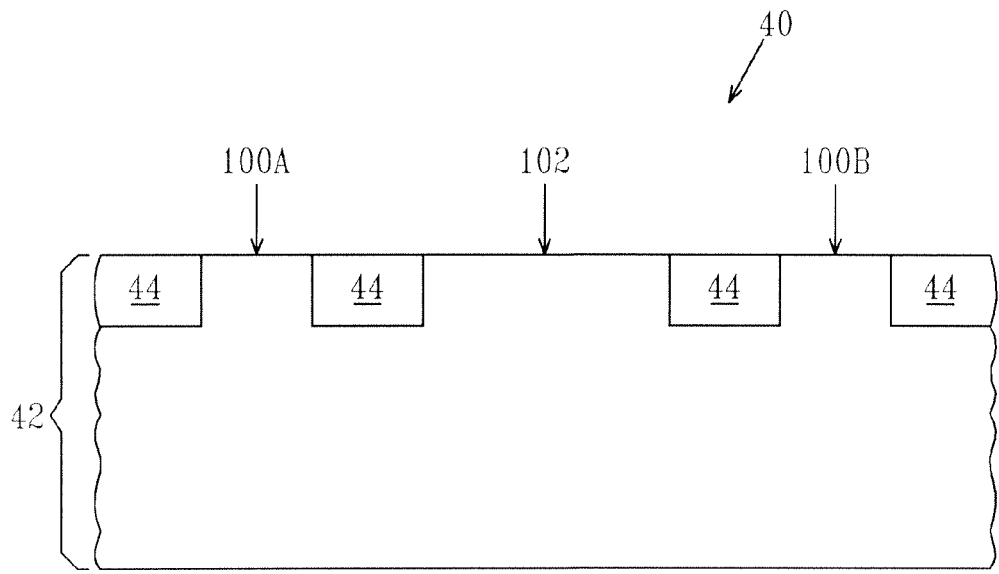
FIGS. 3A-3D are pictorial representations (through cross sectional views) illustrating the basic processing steps that are used in the present invention for fabricating a substrate that includes a hyperabrupt junction and a compensated cathode contact.

Reference is first made to FIGS. 3A-3D which illustrate the basic process flow that is used in the present invention to form the one mask hyperabrupt junction varactor with a compensated cathode contact. Specifically, FIG. 3A illustrates an initial structure 40 that can be used in the present invention. As shown, the initial structure 40 comprises a semiconductor substrate 42 having a plurality of isolation regions 44 formed therein.

The semiconductor substrate 42 comprises any semiconductor material including, but not limited to: Si, SiGe, SiC, SiGeC, GaAs, InAs, InP, layered semiconductors such as Si/SiGe, Si/SiGeC, silicon-on-insulators (SOIs) and silicon germanium-on-insulators (SGOIs). Typically, the semiconductor substrate 42 comprises a Si-containing semiconductor such as Si.

The plurality of isolation regions 44 may include trench isolation regions (as shown), or alternatively, the isolation regions 44 may comprise field oxide (FOX) isolation regions (not shown). The isolation regions 44 are formed utilizing techniques that are well known in the art. For example when the isolation regions 44 are FOX isolation regions, a conventional local oxidation of silicon process can be used. Alternatively when the isolation regions 44 are comprised of trench isolation regions, the trench isolation regions 44 are formed by lithography, etching and trench fill. The lithographic step includes applying a photoresist to the surface of the substrate 42, exposing the photoresist to a desired pattern of radiation and developing the exposed photoresist using a conventional resist developer. The etching step using in forming the trench isolation regions 44 comprises a dry etching process, such as, for example, reactive-ion etching, ion beam etching, plasma etching or laser ablation, or a wet etching process in which a chemical etchant is used. The trench fill process includes the deposition of a trench dielectric material such as an oxide. The formation of the trench isolation regions 44 may further include a densification and/or planarization process.

The plurality of isolation regions 44 defines various regions of the substrate including cathode contact regions 100A and 100B and an anode region 102. Although showing two cathode contact regions, the inventive method also contemplates a structure that includes a single cathode contact region.

Figure 3B:
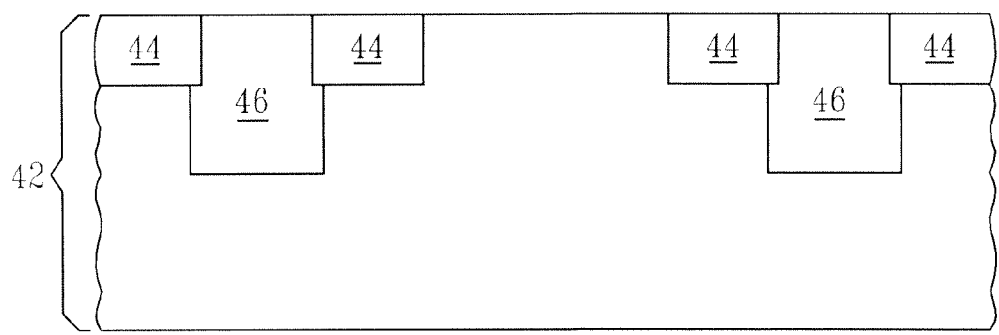

Next, and as shown in FIG. 3B, a first dopant region 46 is formed into exposed portions of the substrate in the cathode contact regions 100A and 100B, for example. The first dopant region 46 may also be referred to as a reach-though dopant region. The first dopant region 46, i.e., reach-through dopant region, contains a first conductivity type dopant which can be either an n-type dopant or a p-type dopant. Preferably, the first dopant region 46 contains an n-type dopant.

The first dopant region 46 is formed by lithography and ion implantation. The ion implantation step is performed utilizing conventional ion implantation conditions that are well known to those skilled in the art. Typical conditions for forming the first dopant region 46 which includes an n-type dopant, such as As, Sb or P, include, but are not limited to: selecting an ion dose from about $10^{14}$ to about $10^{16}$ atoms/cm$^3$ and an energy from about 20 to about 800 keV. When a p-type dopant such as B or Ga is implanted at this point of the present invention, the following conditions can be used: selecting an ion dose from about $10^{14}$ to about $10^{16}$ atoms/cm$^2$ and an energy from about 10 to about 400 keV. This first dopant region 46 can be formed by utilizing standard CMOS FET wells or could also be formed by utilizing BiCMOS/Bipolar reach-through/shunt processing which is commonly practiced to electrically contact the subcollector of a bipolar device.

The concentration of dopant within the first dopant region 46 various depending about the dose and type of ion employed. A typical concentration range for an n-type dopant within the first dopant region 46 is from about $10^{18}$ to about $10^{20}$ atoms/cm$^3$, while a typical concentration range for a p-type dopant within the first dopant region 46 is from about $10^{18}$ to about $10^{20}$ atoms/cm$^3$.

Figure 3C:
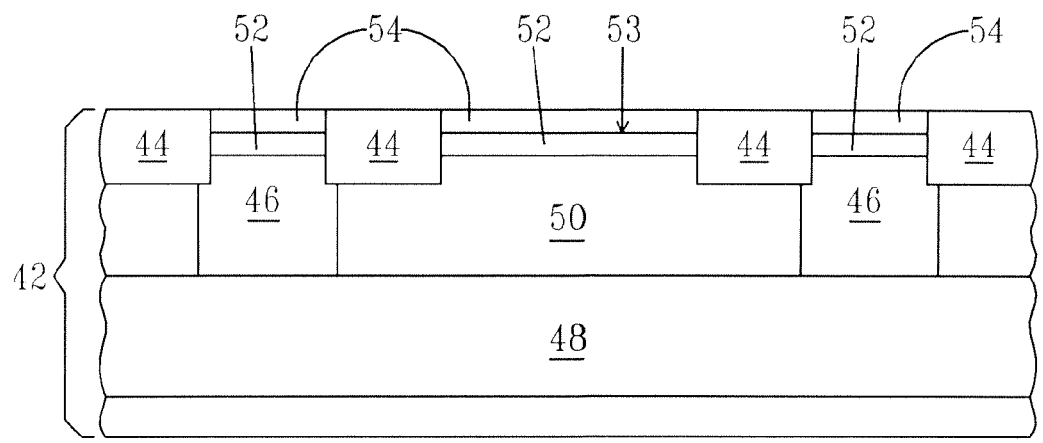

The implant mask used in forming the first dopant region 46 is then removed from the structure utilizing a conventional stripping process. Another implant mask (not shown) is then formed on the structure and is used in forming a second dopant region 48, a third dopant region 50, a fourth dopant region 52 and a fifth dopant region 54. The second dopant region 48 represents either a subcollector/cathode region, and the third dopant region 50 represents a collector/well region. The fourth dopant region 52 represents the lower dopant region of the hyperabrupt junction, while the fifth dopant region 54 denotes the upper dopant region of the hyperabrupt junction. FIG. 3C shows the structure including these various dopant regions.

In accordance with the present invention, the second dopant region 48, the third dopant region 50 and the fourth dopant region 52 each contain the same conductivity type dopant, e.g., first conductivity type dopant, as the first dopant region 46, while the fifth dopant region 54 includes a second conductivity dopant that is opposite to the first conductivity type. In one embodiment, which is highly preferred, dopant regions 46, 48, 50 and 52 contain an n-type dopant, while region 54 contains a p-type dopant. The opposite doping configuration is also contemplated herein. The interface 53 formed between the fifth dopant region 54 and the fourth dopant region 52 forms the junction of the hyperabrupt junction varactor.

In the present invention, the depth D2 of the second dopant region 48 is deeper than the depth D3 of the third dopant region 50, while the depth D3 of the third dopant region 50 is deeper than the depth D4 of the fourth dopant region 52, while the depth D4 of the fourth dopant region 52 is deeper than the depth D5 of the fifth dopant region 54. That is D2>D3>D4>D5.

In accordance with the present invention, the second dopant region 48 is typically first formed, followed by the formation of the fourth dopant region 52 and the fifth dopant region 54; the third dopant region 50 forms during the forming of the second dopant region 52. Although this order is specifically described, other orders of implants and thus forming dopant regions 48, 52 and 54 are contemplated.

In particular, a photomask is applied to the surface of the structure shown in FIG. 3B utilizing a conventional deposition process. A lithographic process is then used to open the photomask over the entire structure. A second implant step is then performed to create the second dopant region (subcollector/cathode) 48 under the surface of the substrate 42 such that it is in contact with the first dopant region 46, i.e., reach-through implant region. The shallower tail of this second implant step effectively creates the third dopant region 50 atop the second dopant region 48, as shown in FIG. 3C.

Specifically, the second dopant region 48 is created by implanting a dopant of the first conductivity type, preferably n-type, into the structure using ion implantation conditions that are capable of forming a subcollector/cathode into the substrate 42. The ion implant conditions used in forming the second dopant region 48 may vary depending on the type of dopant ion used. For n-type dopants, which are preferred, an ion dose from about $5\times10^{13}$ to about $10^{15}$ atoms/cm$^2$ and an energy from about 300 to about 1500 keV is typically utilized. For p-type dopants, an ion dose from about $5\times10^{13}$ to about $10^{15}$ atoms/cm$^2$ and an energy from about 200 to about 800 keV is typically utilized. The concentration of dopants within the second dopant region 48 is dependent on the ion dose used during the implant. Typically, the second dopant region 48 has an n-type dopant concentration from about $10^{18}$ to about $10^{20}$ atoms/cm$^3$. A typical concentration for a p-type dopant would be from about $10^{18}$ to about $10^{20}$ atoms/cm$^3$. Note that the second dopant region 48 has a higher doping concentration than the third dopant region 50, which is formed during this second implant step as well. Specifically, the third dopant region 50 represents a shallower dopant tail of the second dopant region 48. The third dopant region 50 thus comprises the same conductivity type dopant as that of the second dopant 48 however, the third dopant region 50 has a lower dopant concentration than that of the second dopant region. Typically, the third dopant region 50, e.g., the collector or well region, has an n-type dopant concentration from about $10^{17}$ to about $10^{19}$ atoms/cm$^3$. A typical p-type dopant concentration for the third dopant region 50 would be within the range from about $10^{17}$ to about $10^{19}$ atoms/cm$^3$.

Next, the fourth dopant region 52, i.e., the lower dopant region of the hyperabrupt junction, is formed via ion implantation of a first conductivity dopant into the exposed portions of the substrate 42. Preferably, the fourth dopant region 52 comprises an n-type dopant. When an n-type dopant is used, the ion implantation step used in forming the fourth dopant region 52 includes an ion dose from about $10^{13}$ to about $10^{14}$ atoms/cm$^2$ and an energy from about 30 to about 300 keV depending on what dopant species is utilized. When a p-type dopant is used, the implant conditions include an ion dose from about $10^{13}$ to about $10^{14}$ atoms/cm$^2$ and an energy from about 10 to about 300 keV. The fourth dopant region 52 is a heavily doped region as compared to the underlying third dopant region 50. Typically, the fourth dopant region 50 has an n-type dopant concentration from about $10^{17}$ to about $10^{19}$ atoms/cm$^3$. A typical p-type dopant concentration for the fourth dopant region 52 would be within the range from about $10^{17}$ to about $10^{19}$ atoms/cm$^3$.

Following the formation of the fourth dopant region 52, the fifth dopant region 54, e.g., the upper layer of the hyperabrupt junction, is formed by another implant step. Unlike the previous implants in which a first conductivity type dopant was employed, the implant step used in forming the fifth dopant region 54 utilizes a second conductivity type dopant, which differs in conductivity from the first conductivity type dopant. For example, and in the preferred embodiment in which regions 46, 48, 50 and 52 include an n-type region, the fifth dopant region 54 comprises a p-type dopant. The opposite dopant configuration is also contemplated. When a p-type dopant is employed in forming the fifth dopant region 54, the implant conditions include an ion dose from about $5 \times 10^{14}$ to about $10^{16}$ atoms/cm$^2$ and an energy from about 5 to about 30 keV. When an n-type dopant is used, the implant conditions used in forming the fifth dopant region 54 include a dose from about $5 \times 10^{14}$ to about $10^{16}$ atoms/cm$^2$ and an energy from about 10 to about 150 keV. The concentration of second conductivity type dopant within the fifth dopant region 54 is typically from about $10^{19}$ to about $10^{21}$ atoms/cm$^3$.

Note that the various implants used in forming the fourth and fifth dopant regions 52, 54, respectively, are effectively implanted into both the cathode regions 100A and 100B and the anode region 100B. In accordance with the present invention, the forming of the upper dopant region of the hyperabrupt junction, i.e., fifth dopant region 54, is performed at high enough doses to form a diode layer of the varactor, yet low enough to be compensated for in the cathode contact region.

Figure 3D:
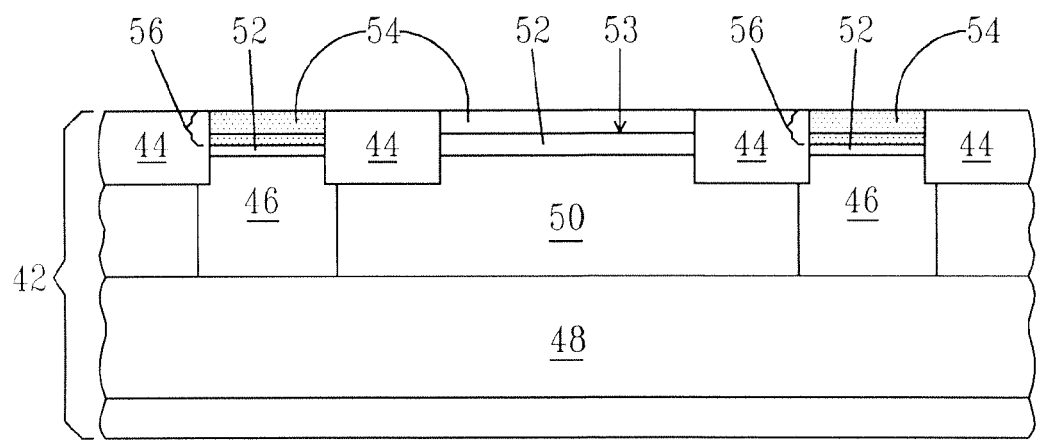

The implant mask used to create regions 48, 50, 52 and 54 is then removed from the structure and another implant mask is applied and patterned to expose the cathode regions 100A and 100B. Next, a standard source/drain implant from CMOS FET processing with a first conductivity type dopant is performed which forms highly doped region 56 within the cathode regions 100A, and 100B, as shown. By "highly doped region", it is meant a dopant region having a dopant concentration of about $10^{20}$ atoms/cm$^3$ or greater. Specifically, this implant compensates the fifth dopant region 54 at the surface of the first dopant region 46 creating a first conductivity type dopant region from the surface of first dopant region 46 down to the second dopant region 48, as is shown in FIG. 3D. One can simply utilize the implant used for the source/drain of a FET as long as the fifth dopant region 54 is performed at a dose low enough and region shallow enough to be compensated by this standard FET source/drain implant that is opposite conductivity type as this fifth dopant region 54.

As stated above, the implant mask used in the highly doped region 56 is removed from the structure and thereafter silicide contacts 58 are formed utilizing a conventional silicidation process. Specifically, the silicide contacts 58 are formed by depositing a metal that is capable of reacting with silicon on the surface of the structure shown in FIG. 3D. The metal used in forming the silicide comprises a conductive metal such as, for example, Ti, Ta, Ni, Co, W, Pd, Pt, Rh, Ir, Au and alloys thereof. If the substrate does not include silicon, a silicon-containing layer, such as, for example, epi-Si, can be formed on the surface of the substrate prior to forming the metal. The metal is formed utilizing a conventional deposition process such as, for example, chemical vapor deposition, plasma enhanced chemical vapor deposition, sputtering, evaporation, atomic layer deposition, chemical solution deposition or other like processes. The thickness of the metal layer may vary and is not critical so long as it is sufficiently thick to cause silicide formation. The structure including the metal is then annealed under conditions which cause reaction between the metal and silicon and subsequent formation of a stable silicide that is in its lowest resistance phase. The silicide anneal may include a single anneal step, followed by an etching step that removes any non-reacted metal, or a two step anneal in which a second anneal, typically at higher temperatures than the first anneal, is performed. The conditions of the anneals, i.e., time and temperature, may vary depending on the type of silicide to be formed and such conditions are well known to those skilled in the art.

Figure 4:
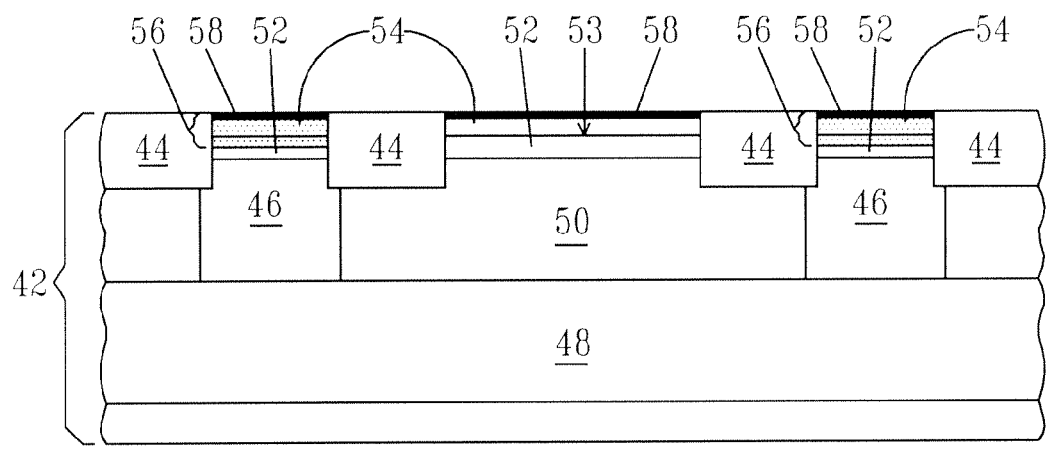
FIG. 4 is a pictorial representation (through a cross sectional view) illustrating the substrate of FIG. 3D after silicidation of the exposed semiconductor regions.
Figure 5:
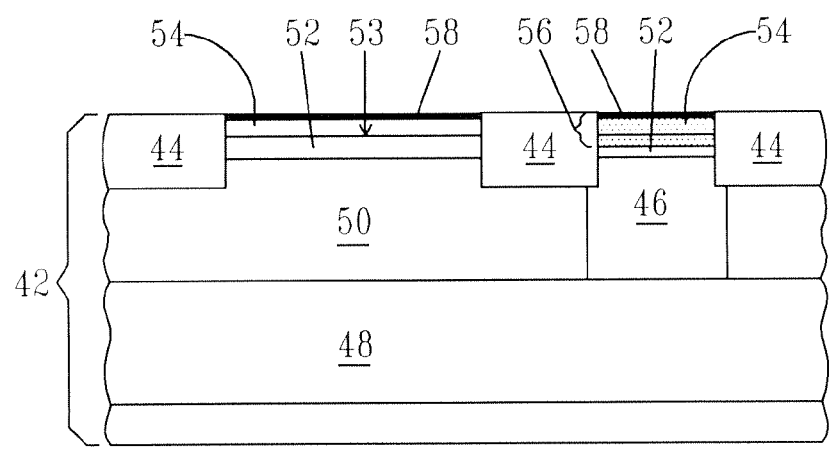
FIG. 5 is a pictorial representation (through a cross sectional view) illustrating a similar substrate as shown in FIG. 4 except that a single cathode contact is formed; this substrate is made using the same basic processing steps as shown in FIGS. 3A-3D except that a single reach-through implant region is formed.

FIG. 4 shows the structure that is formed after the silicidation formation which forms silicide contacts 58 over the cathode regions 100A and 100B and the anode region 100. FIG. 5 shows a structure that is similar to the one depicted in FIG. 4 except that a single cathode contact is illustrated.

The structures shown in FIG. 4 or 5 can be used as a substrate in which one or more bipolar devices, CMOS devices or a combination thereof (BiCMOS devices) can be formed. The fabrication of these various devices is well known to those skilled in the art and thus the fabrication of CMOS and/or bipolar devices is not needed to be mentioned herein.

To illustrate that the method of the present invention is capable of forming a hyperabrupt junction varactor which meets current specification reference is made to Table 1 which compares the invention hyperabrupt junction varactor to a prior art hyperabrupt junction varactor that was made using a two mask process. The prior art structure looks very similar to the inventive structure but with only the reach-through implant region 46 in the cathode region (i.e. minus regions 56, 54 and 52 from the cathode contact region).

TABLE 1

| Structure | $C_{max}$ (fF/μm$^2$) | Tuning Ratio | 2 Ghz, min Q | 2 Ghz, max Q | 5 Ghz, min Q | 5 Qhz, max Q |
| --- | --- | --- | --- | --- | --- | --- |
| Prior Art | 2.5 | 3.4 | 95 | 400 | 35 | 150 |
| Invention | 3.0 | 3.5 | 102 | 415 | 41 | 168 |

Figure 2:
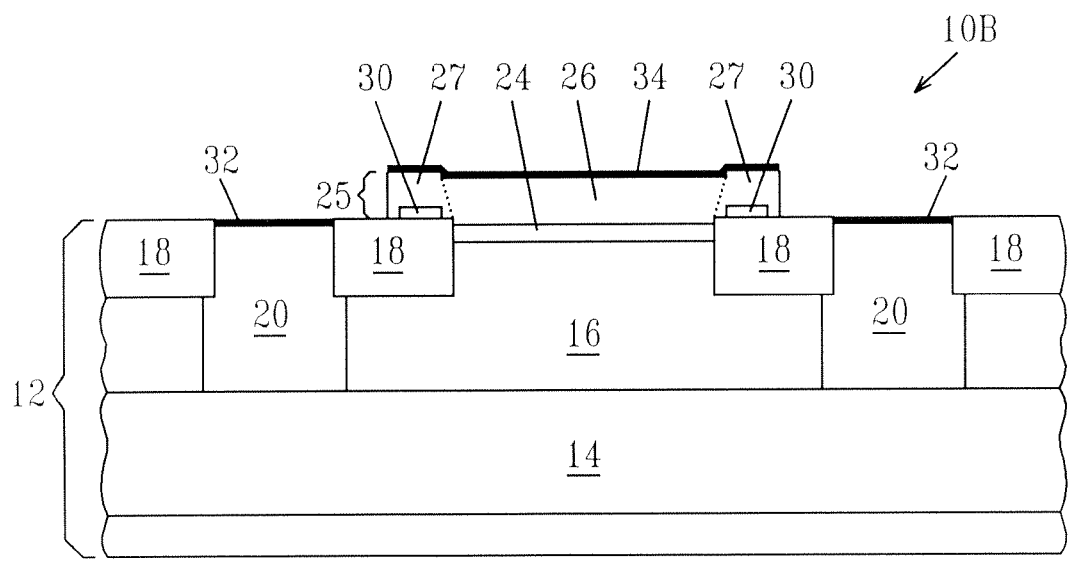
FIG. 2 is a pictorial representation (through a cross sectional view) illustrating a prior art structure including a hyperabrupt junction and two cathode contacts or a wraparound cathode contact.

The results presented in Table 1 show that the inventive hyperabrupt junction varactor, which is made using a simpler process than the prior art hyperabrupt junction varactor, had similar tunability and quality factor, Q characteristics. These results shows that the inventive method fabricates a hyperabrupt junction varactor that is equivalent, in terms of tunability and Q factor, as compared with prior art hyperabrupt junction varactors. The advantage of the present invention resides in the fact that the inventive hyperabrupt junction varactor can be formed utilizing a simpler method than that disclosed in the prior art. It is noted that unlike the prior art structures shown in FIGS. 1 and 2, in which the hyperabrupt junction varactor is made using at lease two critical masking levels, the inventive structures includes a compensated cathode contact.

While the present invention has been particularly shown and described with respect to preferred embodiments thereof, it will be understood by one skilled in the art that the foregoing and other changes in forms and details may be made without departing from the spirit and scope of the invention. It is therefore intended that the present invention is not limited to the exact forms and details described and illustrated, but falls within the spirit and scope of the appended claims.

What is claimed is:

1. A semiconductor structure comprising:
   a hyperabrupt junction located in an anode region of a semiconductor substrate; and
   at least one compensated cathode contact located in a cathode contact region of said semiconductor substrate and adjacent to, yet isolated from, said hyperabrupt junction, said at least one compensated cathode contact extends to an upper surface of said semiconductor substrate and vertically abuts a surface of a dopant region of a first conductivity type which lies directly on a surface of a reach-through dopant region, wherein an entirety of said at least one compensated cathode contact including an upper region thereof is of said first conductivity type, said at least one compensated cathode contact having a higher concentration of first conductivity type dopants as compared to said dopant region and said reach-through dopant region, and said reach-through dopant region is of the first conductivity type and is in contact with an underlying subcollector or cathode region.

2. The semiconductor structure of claim 1 wherein said hyperabrupt junction comprises an upper dopant region and a lower dopant region of opposite conductivity.

3. The semiconductor structure of claim 2 wherein said upper dopant region comprises a p-type dopant, and said lower dopant region comprises an n-type dopant.

4. The semiconductor structure of claim 2 wherein said upper dopant region comprises an n-type dopant, and said lower dopant region comprises a p-type dopant.

5. The semiconductor structure of claim 1 wherein two compensated cathode contacts are located abutting the hyperabrupt junction.

6. The semiconductor structure of claim 1 further comprising a suicide located atop said hyperabrupt junction and said at least one compensated cathode contact.

7. A semiconductor structure comprising:
  a hyperabrupt junction comprising a p-type upper dopant region and an n-type lower dopant region located in an anode region of a semiconductor substrate; and
  at least one compensated cathode contact located in a cathode contact region of said semiconductor substrate and adjacent to, yet isolated from, said hyperabrupt junction, said at least one compensated cathode contact extends to an upper surface of said semiconductor substrate and vertically abuts a surface of an n-type dopant region which lies on a surface of an n-type reach-through dopant region, wherein an entirety of said at least one compensated cathode contact including an upper region thereof comprises n-type dopants, said at least one compensated cathode contact having a higher concentration as compared to said n-type dopant region and said n-type reach-through dopant region, and said n-type reach-through dopant region is in contact with an underlying subcollector and/or cathode region.

8. The semiconductor structure of claim 7 wherein two compensated cathode contacts are located abutting the hyperabrupt junction.

9. The semiconductor structure of claim 7 further comprising a silicide located atop said hyperabrupt junction and said at least one compensated cathode contact.

* * * * *